United States Patent [19]

Kilian

[11] Patent Number: 5,435,070
[45] Date of Patent: Jul. 25, 1995

[54] SIMPLIFIED COMPASS WITH MULTIPLE SEGMENT DISPLAY CAPABILITY

[75] Inventor: Wayne T. Kilian, Dallas, Tex.

[73] Assignee: Honeywell Inc., Minneapolis, Minn.

[21] Appl. No.: 98,084

[22] Filed: Jul. 26, 1993

[51] Int. Cl.$^6$ .................. G01C 17/02; G01R 33/09
[52] U.S. Cl. .................. 33/361; 33/355 R; 324/247; 324/252
[58] Field of Search ............... 324/165, 207.21, 207.25, 324/244, 247, 252, 260, 251; 33/351, 352, 355 R, 361, 363 R, 363 Q; 341/15; 364/443, 444, 457

[56] References Cited

U.S. PATENT DOCUMENTS

| | | | |
|---|---|---|---|
| 3,728,565 | 4/1973 | O'Callaghan | 324/165 X |
| 4,163,326 | 8/1979 | Edwards | 324/251 X |
| 4,283,679 | 8/1981 | Ito et al. | 324/165 |
| 4,340,936 | 7/1982 | Mounce | 364/443 |
| 4,373,271 | 2/1983 | Nitz | 324/251 X |
| 4,503,394 | 3/1985 | Kawakami et al. | |
| 4,506,339 | 3/1985 | Kühnlein | 324/163 X |
| 4,553,872 | 8/1985 | Boord et al. | |
| 4,640,016 | 2/1987 | Tanner et al. | |
| 4,847,584 | 7/1989 | Pant | |
| 4,890,105 | 12/1989 | Bean et al. | |
| 4,918,824 | 4/1990 | Farrar | |
| 5,046,260 | 9/1991 | Wellhausen | |
| 5,161,311 | 11/1992 | Esmer et al. | |
| 5,175,936 | 5/1993 | Sato | |
| 5,199,178 | 4/1993 | Tong et al. | |
| 5,241,270 | 8/1993 | NG | 324/251 |
| 5,255,442 | 10/1993 | Schierbeek et al. | 324/252 X |

OTHER PUBLICATIONS

Article by Bharat B. Pant entitled "Magnetoresistive Sensors" which appeared in Fall 1987 Scientific Honeyweller.

Article by George Wu entitled "Properties of Thin Magnetoresistive Films" which appeared in Jun. 1982 Scientific Honeyweller.

Article by R. B. Fryer entitled "Thin Film Magnetic Sensors" which appeared in Jun. 1982 Scientific Honeyweller.

Article by James Holmen entitled "The Development of Thin-Film Sensors" which appeared in the Jun. 1982 Scientfic Honeyweller.

Article by James E. Lenz entitled "Magnetic Sensors" which appeared in the Apr. 1985 issue of Scientific Honeyweller.

Primary Examiner—Gerard R. Strecker
Attorney, Agent, or Firm—William D. Lanyi

[57] ABSTRACT

An apparatus for determining the direction of a magnetic field is provided with a plurality of magnetically sensitive components arranged with their sensing axes equally spaced around a circular configuration. Each magnetically sensitive component is capable of providing a binary signal representing the resolution of the direction of a magnetic field along one of the two possible directions aligned with its sensing axis. The binary signals from each of the plurality of magnetically sensitive components is arranged to provide a grey code output that can be used to directly determine the direction that the apparatus is pointing toward. The compass points that can be resolved is related to the number of magnetically sensitive components by a ratio of two to one. For example, the use of four magnetically sensitive components permits the resolution of eight compass directions.

7 Claims, 8 Drawing Sheets

| DISPLAY | GREY CODE | LEFT DISPLAY | RIGHT DISPLAY |
|---|---|---|---|
| N | 1111 | | mnpqrv |
| NW | 0111 | bcefgk | mnpquv |
| W | 0101 | | mnpquv |
| SW | 0001 | abdehi | mnpquv |
| S | 0000 | | lmopst |
| SE | 1000 | abdehi | lmnost |
| E | 1010 | | lmnost |
| NE | 1110 | bcefgk | lmnost |

| DISPLAY | GREY CODE | LEFT DISPLAY | RIGHT DISPLAY |
|---|---|---|---|
| N | 1111 | | mnpqrv |
| NW | 0111 | bcefgk | mnpquv |
| W | 0101 | | mnpquv |
| SW | 0001 | abdehi | mnpquv |
| S | 0000 | | lmopst |
| SE | 1000 | abdehi | lmnost |
| E | 1010 | | lmnost |
| NE | 1110 | bcefgk | lmnost |

SIMPLIFIED COMPASS WITH MULTIPLE SEGMENT DISPLAY CAPABILITY

BACKGROUND OF THE INVENTION

1. Field of the Invention

The present invention is generally related to devices for determining the direction of a magnetic field and, more particularly, to a device which provides a digital output that is directly representative of a compass direction.

2. Description of the Prior Art

Many different ways of measuring magnetic fields are well known to those skilled in the art. For example, Hall effect devices and permalloy elements have been used in many different configurations to determine the magnitude or direction of a magnetic field.

U.S. Pat. No. 4,553,872, which issued to Boord et al on Aug. 6, 1985, discloses a magnetic field sensor element that is capable of measuring magnetic field components. The sensor can be rendered preferentially sensitive to magnetic field components in each of two, preferably orthogonal, directions by application of appropriate magnetic bias fields. When a first magnetic bias field is applied to the sensor element, the sensor is rendered sensitive to external magnetic field components in a first direction. When a second magnetic bias field is applied to the sensor element, the sensor is rendered sensitive to external magnetic field components in a second direction. The external magnetic field components measured by the sensor in this manner may then be used to calculate the orientation of the sensor with respect to the direction of the external magnetic field.

U.S. Pat. No. 4,503,394, which issued to Kawakami et al on Mar. 5, 1985, describes a magnetoresistive sensor which has a closed domain structure and electrode biasing. A magneto electric conversion element of this device comprises a magnetoresistive effect material having a closed domain structure, a pair of contacts for supply of current flowing through the magnetoresistive effect material and a bias electrode disposed between the contacts for biasing the direction of the current flow. The bias electrode is disposed so that the respective angles of intersection between the direction of current flow through different magnetic domains of the magnetoresistive effect material biased by the bias electrode and the directions of spontaneous magnetization biased by an external magnetic field are both increased or decreased.

U.S. Pat. No. 4,847,584, which issued to Pant on Jul. 11, 1989, discloses a magnetoresistive magnetic sensor which has a plurality of magnetoresistive material strips. The sensor has conductors positioned over the strips near the ends, but isolated therefrom. The strips are interconnected with interconnections located between the conductors. Strip ends may be tapered outside of the conductors. A plurality of arrangements of this type may be interconnected.

U.S. Pat. No. 5,199,178, which issued to Tong et al on Apr. 6, 1993, describes a thin film magnetic fluxgate compass having a supporting substrate on which a layer of high permeability material and at least two layers of nonmagnetic conducting materials are deposited. The high permeability material is fabricated to form a magnetic core, or cores, and a portion of the nonmagnetic conducting layers is fabricated to form an excitation coil which is connected to a pulse generator. The remainder of the nonmagnetic conducting layers is fabricated into at least two sensing coils or two pairs of sensing coils wound around the core in opposite pairs. A method for the fabrication of the thin film compass is also disclosed in this patent and the compass can be used for the determination of the direction of the geomagnetic field.

U.S. Pat. No. 5,175,936, which issued to Sato on Jan. 5, 1993, describes an electronic compass which can store azimuth data of points to be passed by a user in a plurality of registers. The stored azimuth data are sequentially displayed on a display device every time an external operation switch is operated. The compass includes a magnetic sensor for detecting a geomagnetism, thereby obtaining north azimuth data on the earth.

U.S. Pat. No. 5,161,311, which issued to Esmer et al on Nov. 10, 1992, discloses an electronic compass for use in a vehicle. The compass includes compensation for obtaining a high degree of accuracy without operator intervention or the need to drive the vehicle in a deliberate circular path. An automatic method for accurately determining maximum and minimum voltage values from a fluxgate sensor having orthogonal sensing windows is provided that operates continuously to adjust for required changes in both the offset and gain compensation factors.

U.S. Pat. No. 5,046,260, which issued to Wellhausen on Sep. 10, 1991, describes an electronic compass which has a plurality of sensors. Each sensor reacts to a component of the earth's field. It is desired to prevent errors based on variations in the signal amplification and to improve the accuracy of measurement. In accordance with this device, three identical sensor are disposed at an angle of 120 degrees and the compass may be used, in particular, for the navigation of vehicles.

U.S. Pat. No. 4,918,824, which issued to Farrar on Apr. 24, 1990, describes an electronic digital compass which utilizes an amorphous magneto resistive wire exhibiting reentrant behavior as a core. A sensing wire is wrapped around the core and the core is driven with a triangular wave through a drive coil. The earth's magnetic field biases the core such that when the core is driven to reentrant jumps the time duration between adjacent pulses induced into the sense winding is related to the heading. A pair of such arrangements are used in physical right angle relationship to resolve ambiguities in heading angle. The resulting heading angle calculation is a true digital product which is independent of analog amplitude variations and requires little or no adjustment for accuracy.

U.S. Pat. No. 4,640,016, which issued to Tanner et al on Feb. 3, 1987, discloses a remote indication compass which is formed by a magnetic compass and magnetoresistive sensors attached to the compass. It measures the field created by the magnetic compass. The signal of the sensors is analogous as well as cyclic with respect to the angle between the fastening plate of the sensors and the northern direction indicated by the magnetic compass. The length of a complete cycle is 360 degrees. The angle between the sensors is selected in such a manner that the flat areas of the signals do not coincide.

An article, entitled Magnetoresistive Sensors by Bharat B. Pant appeared in the Fall 1987 issue of the Scientific Honeyweller on pages 29-34. In this article, several different arrangements of magnetoresistive elements are described and several different applications of magnetoresistive magnetic detectors are discussed.

In the June 1982 issue of the Scientific Honeyweller three articles appeared which discuss magnetoresistive films. An article titled Properties of Thin Magnetoresistive Films, by George Wu, describes, on pages 34–36, the electrical and magnetic characteristics of magnetoresistive films. In addition to describing the anisotropy characteristic, both due to the material and the shape of a magnetoresistive film, this article also discloses empirical information relating to the relationship between the change in resistance of a magnetoresistive element and an external field applied to it. In the same issue of the Scientific Honeyweller, an article titled Thin Film Magnetic Sensors, by R. B. Fryer, describes, on pages 32–34, the magnetoresistive effect and certain applications of magnetic sensors. On pages 29–31 of the same issue of the Scientific Honeyweller, an article titled The Development of Thin-Film Sensors" by James Holmen, describes certain information obtained during the development of magnetic thin-films.

An article titled Magnetic Sensors, by James E. Lenz, appeared on pages 16–25 of the April 1985 issue of the Scientific Honeyweller. This article compares the operational ranges of several magnetic related technologies and describes experimental data obtained during the development of several of those technologies. In addition, this article discloses certain specific applications in which some of the magnetic sensing technologies have found particular application.

In a typical arrangement of magnetoresistive elements, the magnetically sensitive resistors are arranged in a Wheatstone bridge arrangement in order to measure the change in resistance which results from the effect of a magnetic field imposed on the resistors. By physically arranging four Wheatstone bridge resistors in an appropriate configuration, the effect on each bridge resistor can be used to provide an output signal that is representative of the angle between the Wheatstone bridge arrangement and the direction of a magnetic field. As the Wheatstone bridge arrangement is rotated relative to a magnetic field, the output signal from the Wheatstone bridge typically changes in a sinusoidal manner as a function of the angular relationship between the sensing axis of the Wheatstone bridge and the direction of magnetic field.

By using appropriate bias control devices, an analog output signal from a Wheatstone bridge of magnetoresistive elements can be used to determine the magnitude of a magnetic field component directed along the sensing axis of the magnetically sensitive Wheatstone bridge. A plurality of magnetic field component magnitudes, and their geometrical relationships, can then be used to determine magnetic field location. However, as is well known to those skilled in the art, the magnitude of the output signal is inherently nonlinear and consequently requires levels of precision in amplitude sensing and signal processing that are directly related to the required resolution and accuracy in determining the magnetic field direction.

Because of the nonlinearities in the output from a magnetically sensitive component comprising a Wheatstone bridge of magnetoresistive elements, it is well known to those skilled in the art that a precise determination of magnetic direction is difficult to accomplish. In other words, the change in magnetic field strength measured by a device of this type between a northerly direction and a northeasterly direction may not be equivalent to the change in magnetic field strength from a northeasterly direction to an easterly direction. Also, nonlinearities due to hysteretic material properties of magnetoresistive elements limit the repeatability of the analog signals produced by a Wheatstone bridge comprised of magnetoresistors and deleteriously affect determination of magnetic field direction. Care must be taken to account for these disadvantageous characteristics of magnetoresistive bridge magnetometers when the output signals of those devices are used in an analog manner.

It would therefore be significantly beneficial if a simplified technique is provided in a compass device for digitally decoding the direction of a magnetic field without the need to precisely measure the magnitude of the analog value of a magnetoresistive device.

SUMMARY OF THE INVENTION

The present invention provides an apparatus for determining the direction of a magnetic field. A plurality of magnetically sensitive devices is provided, wherein each of the magnetically sensitive devices has a predefined sensing axis and the capability of resolving the presence of a component of a magnetic field between two opposite directions along said sensing axis. The plurality of magnetically sensitive devices is arranged with the axes equally spaced apart from each other by a preselected angle. Each of the magnetically sensitive devices has a first output signal that is representative of the existence and magnitude of a magnetic field component in a preselected one of the two possible directions along its sensing axis. In addition, a preferred embodiment of the present invention comprises a means for logically combining the first output signal from each of the plurality of magnetically sensitive devices to provide a predefined one of a plurality of second output signals representing the direction of the magnetic field.

The combining means comprises a means for providing a plurality of output bits in the form of a Grey code in a preferred embodiment of the present invention. The second output signals represent magnetic compass directions and, in a most preferred embodiment of the present invention, a means is provided for converting the plurality of second output signals to a form that is compatible with a multiple segment display element.

BRIEF DESCRIPTION OF THE DRAWINGS

The present invention will be more fully understood from a reading of the Description of the Preferred Embodiment in conjunction with the drawings, in which.

DESCRIPTION OF THE PREFERRED EMBODIMENT

Figure 1:
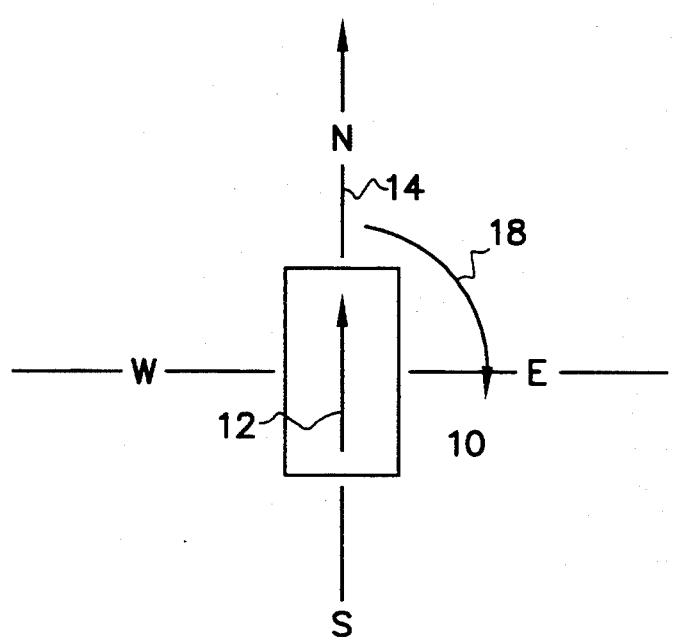
FIG. 1 is an exemplary illustration of a magnetically sensitive component relative to compass directions.

Throughout the Description of the Preferred Embodiment, like components will be identified by like reference numerals. FIG. 1 schematically illustrates an exemplary magnetically sensitive component 10 in relation to magnetic compass directions. The magnetically sensitive component 10 has a sensing axis 12. In a typical application of this type, a plurality of magnetoresistive elements are arranged in such a way that an output signal from the magnetically sensitive component 10 is provided as a function of the angle between the sensing axis 12 and the direction of a magnetic field. For example, in FIG. 1, the sensing axis 12 is aligned with line 14 which represents the hypothetical direction of the magnetic field. Therefore, the angle between the sensing axis 12 and the direction of the magnetic field 14 would be zero. If the output signal from the magnetically sensitive component 10 is a function of the cosine of this angle, its maximum output signal would occur when the component 10 is arranged relative to the magnetic field direction as illustrated in FIG. 1.

Figure 2:
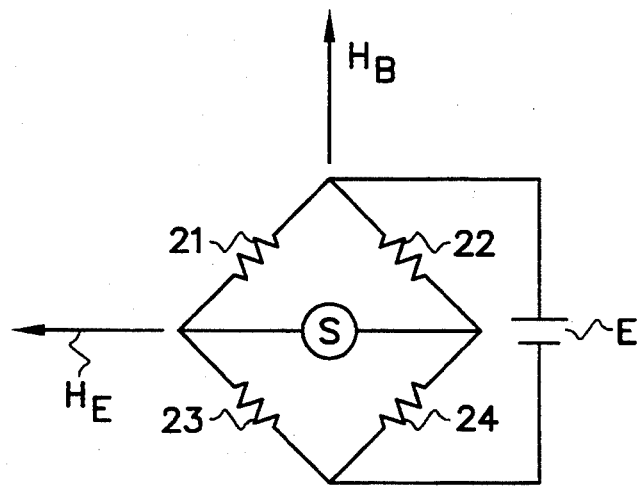
FIG. 2 is an illustration of a Wheatstone bridge using magnetically sensitive resistors.

FIG. 2 illustrates a Wheatstone bridge arrangement comprising four magnetoresistive elements, 21–24. An external magnetic field $H_E$ and a bias magnetic field $H_B$ are also illustrated in FIG. 2.

With continued reference to FIG. 2, it should be understood that magnetoresistors 21 and 24 and magnetoresistors 22 and 23 change in coordination with each other. In other words, resistors on directly opposite sides of the Wheatstone bridge in FIG. 2 increase and decrease together. Therefore, if a voltage potential E is provided as shown, the voltage potential S measured across the opposite corners of the Wheatstone bridge will provide a representation of the magnetic field strength imposed on the bridge.

Figure 3:
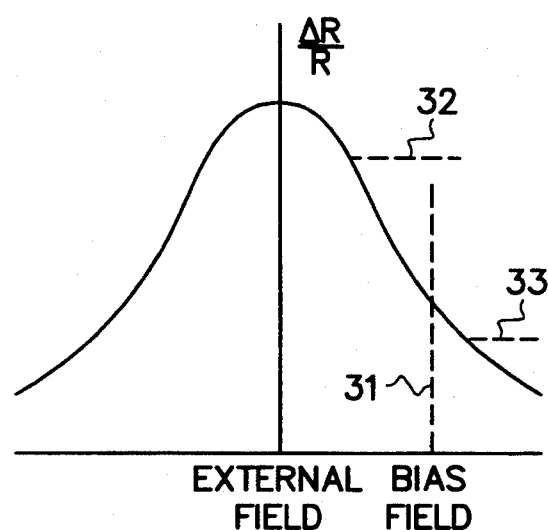
FIG. 3 shows the relationship between the percentage change in resistance of a magnetoresistor and an applied magnetic field.

FIG. 3 illustrates the change in resistance plotted in relation to the magnetic field imposed on a magnetoresistor. With reference to FIGS. 2 and 3, magnetoresistance is expressed as the ratio of the change in the total resistance of the film to the nominal resistance of the film. This is defined by the variation in resistance, from a maximum value when the magnetization is parallel to the current flow through the magnetoresistor to a minimum value of resistance when the magnetization is perpendicular to the current flow through the magnetoresistor. Shown in FIG. 3 is the dependence of the magnetoresistance on the applied field. In order to obtain a relatively linear output, the film is generally subjected to a biased field 31 that places its output in the central area of a portion of the magnetoresistance curve having a generally constant slope. This portion of the magnetoresistive curve is shown between dashed lines 32 and 33 in FIG. 3. The Wheatstone bridge shown in FIG. 2 is the basic underlying electrical element of many different types of magnetoresistive sensors. In the presence of crossed bias and signal fields, the resistances of two opposite legs of the Wheatstone bridge increase and the resistances of the remaining two legs decrease. The bridge therefore develops an output voltage S that is proportional to the signal field.

Figure 4:
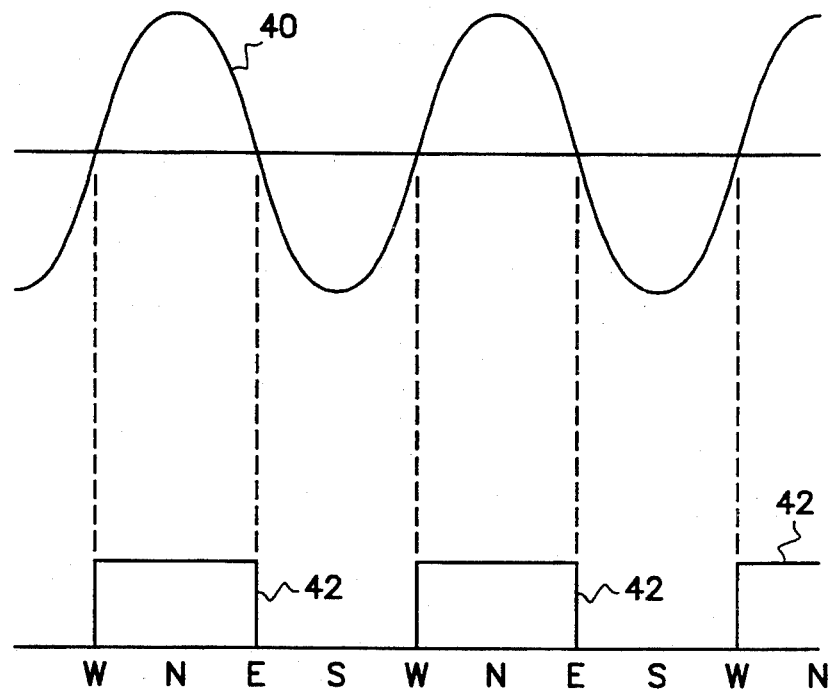
FIG. 4 shows a sinusoidal output and a square wave signal related to the device shown in FIG. 1.

FIG. 4 shows the relationship between the output signal S of a Wheatstone bridge, such as that shown in FIG. 2, and the angle between the sensing axis 12 and the direction of the magnetic field. With reference to FIGS. 1 and 4, if the magnetically sensitive component 10 is rotated about its center in the direction indicated by arrow 18, the output signal from its Wheatstone bridge would resemble signal 40 shown in FIG. 4. Signal 40 is generally sinusoidal and it should be understood that the algebraic sign of the Wheatstone bridge output signal S generally resolves the polarity of the magnetic field component that is directed along its sensing axis. Although the precise magnitude of signal 40 can possibly be used to provide more information about the position of the magnetically sensitive component 10, the algebraic sign of the signal can easily be used to determine whether or not the sensing axis 12 is pointing generally north or generally south. For example, if the algebraic sign of signal 40 is positive, the sensing axis 12 can be assumed to be pointing in a direction between north and west or, alternatively, between north and east. On the other hand, if signal 40 is negative, it can be assumed that the sensing axis 12 is pointing in a direction between south and west or, alternatively, between south and east. This relationship is illustrated in FIG. 4. If the algebraic sign of signal 40 is used to provide a binary signal, such as that identified by reference numeral 42 in FIG. 4, the direction of sensing axis 12 can be resolved into one of two directions. In other words, if the component of the magnetic field measured along the sensing axis 12 is in a first direction, a first signal 42 is provided. Otherwise, a zero signal is provided. This type of simplified resolution of the magnetic field direction into one of two possible alternatives along the sensing axis 12 greatly simplifies the complexity of a magnetometer and, in certain instances, significantly reduces its cost.

Figure 5:
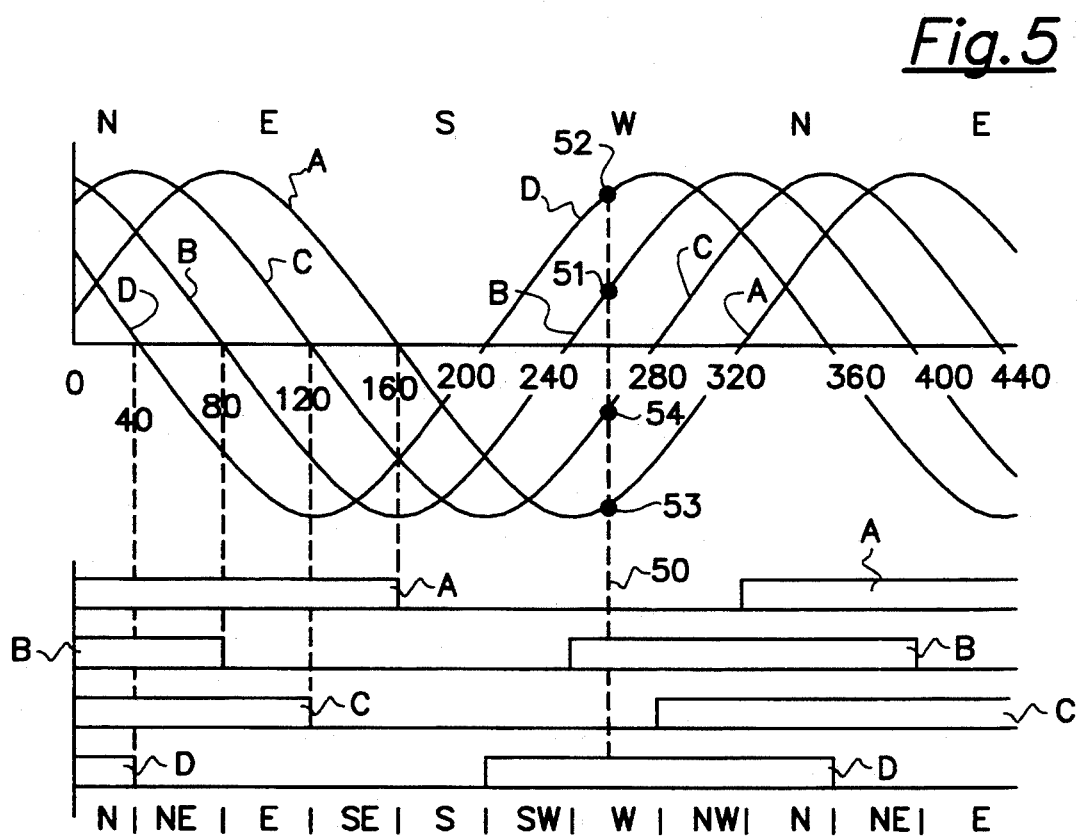
FIG. 5 shows four sinusoidal outputs and four corresponding square wave signals provided by four magnetically sensitive components arranged in accordance with the present invention.

If four individual magnetically sensitive components 10 are physically arranged relative to each other so that their sensing axes 12 are spaced apart from other magnetically sensitive components by a predetermined angle to equally distribute the sensing axes around a complete range of 360 degrees, the output signals from the plurality of magnetically sensitive components 10 will vary according to a predictable pattern if the magnetically sensitive components are rotated relative to a magnetic field. The sinusoidal waveforms identified by reference letters A, B, C and D in FIG. 5 each represent the varying magnitude of output voltage signal S from a Wheatstone bridge such as that illustrated in FIG. 2. It should be understood that many different types of magnetoresistive elements are well known to those skilled in the art. It should also be understood that when the magnetoresistive elements and Wheatstone bridges are made of thin film material, it is common to provide conductive thin film straps located relative to the resistors of the Wheatstone bridge for the purpose of providing bias fields such as the field illustrated in FIG. 3. Therefore, it should be realized that the actual sinusoidal waveforms shown in FIG. 5 are typically converted to some other form of signal in order for other apparatuses to be able to use the signals to determine the direction of a magnetic field relative to the sensing axis of the magnetically sensitive component. In the bottom portion of FIG. 5, square wave signals A, B, C and D are illustrated relative to their corresponding sinusoidal signals in the upper portion of FIG. 5. The square wave signals represent the portion of the angular rotation during which the corresponding sinusoidal signal is algebraically positive. Dashed line 50 and the other dashed lines illustrate the alignment between the sinusoidal and square wave signals. As can be seen, at the angle of rotation represented by dashed line 50, sinusoidal waveform B is positive at point 51 and sinusoidal waveform D is positive at point 52, whereas sinusoidal waveform A is negative at point 53 and sinusoidal waveform C is negative at point 54. In the bottom portion of FIG. 5, square wave signals B and D are correspondingly positive while square wave signals A and C are zero. In other words, the output from a typical magnetically sensitive component comprising a Wheatstone bridge of magnetoresistive elements can provide a binary signal representing the algebraic sign of a sinusoidal waveform. More particularly, a device of this type can provide a binary output that represents the resolution of the magnetic field into one of two alternative directions along its sensing axis.

Figure 6:
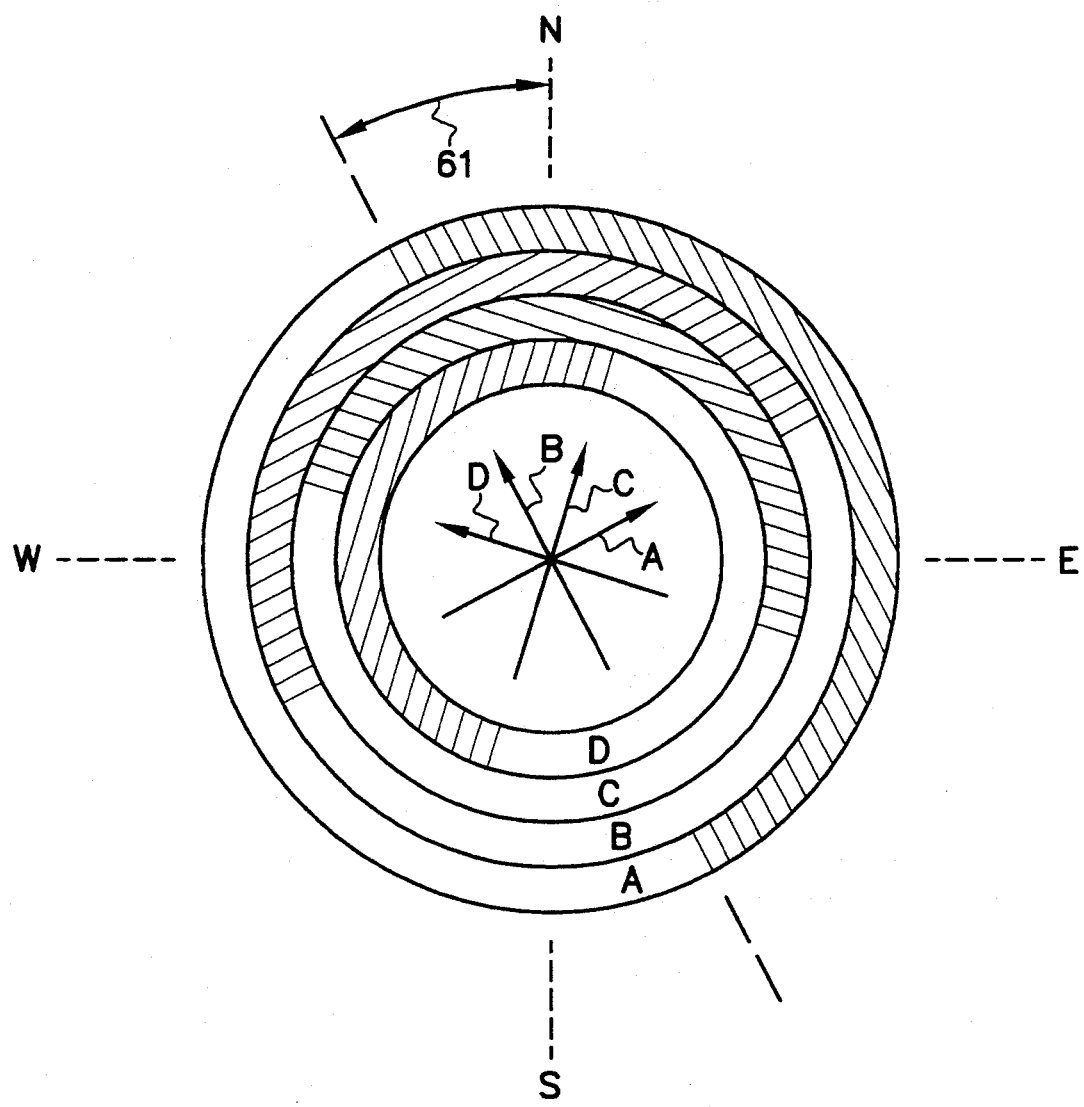
FIG. 6 is a circular representation of the square wave signals shown in FIG. 5.

FIG. 6 illustrates a circular representation of the square wave signals shown in the bottom portion of FIG. 5 and described above. FIG. 6 also shows four sensing axes in the central portion of the figure. The concentric rings in FIG. 6 represent the status of the square wave signal corresponding to each of the four magnetically sensitive components, A, B, C and D. Where the status of the square wave signal is positive, the corresponding ring in FIG. 6 is cross hatched and where the square wave signal is zero, the ring is unmarked. With continued reference to FIG. 6, it can be seen that the four equally spaced sensing axes are offset slightly from alignment with the magnetic compass points illustrated in the outer portion of FIG. 6. More specifically, a line perpendicular to sensing axis A is offset from the north-south axis by an angle of 22.5 degrees as represented by arrow 61. This offset is provided so that the resulting output from the present invention can more accurately be resolved into conventional direction notation, such as N, S, W, E, NW, NE, SW and SE. This will be described in greater detail below.

With continued reference to FIG. 6, it can be seen that a positive square wave output from magnetically sensitive component A will be provided for 180 degrees of rotation of the device. In other words, from a point 22.5 degrees west from directly north in a clockwise direction to a point 22.5 degrees east from directly south, a positive square wave output signal is provided by magnetically sensitive component A. This positive output signal is a result of the resolution of the sinusoidal output of the Wheatstone bridge into one of two directions along the sensing axis. Similarly, the other three output signals are illustrated in the concentric rings of FIG. 6. The particular arrangement of directions of the sensing axis result in the ability to identify the various directions of the compass with significant specificity. In other words, if all four square wave signals, A-D, are positive, the present invention would indicate that it was pointing in a generally north direction. Similarly, if only devices A and C are positive, it is pointing toward the east. With reference to either FIG. 5 or 6, it can be seen that four devices permit the compass to be divided into eight easily distinguishable directions.

Figure 7:
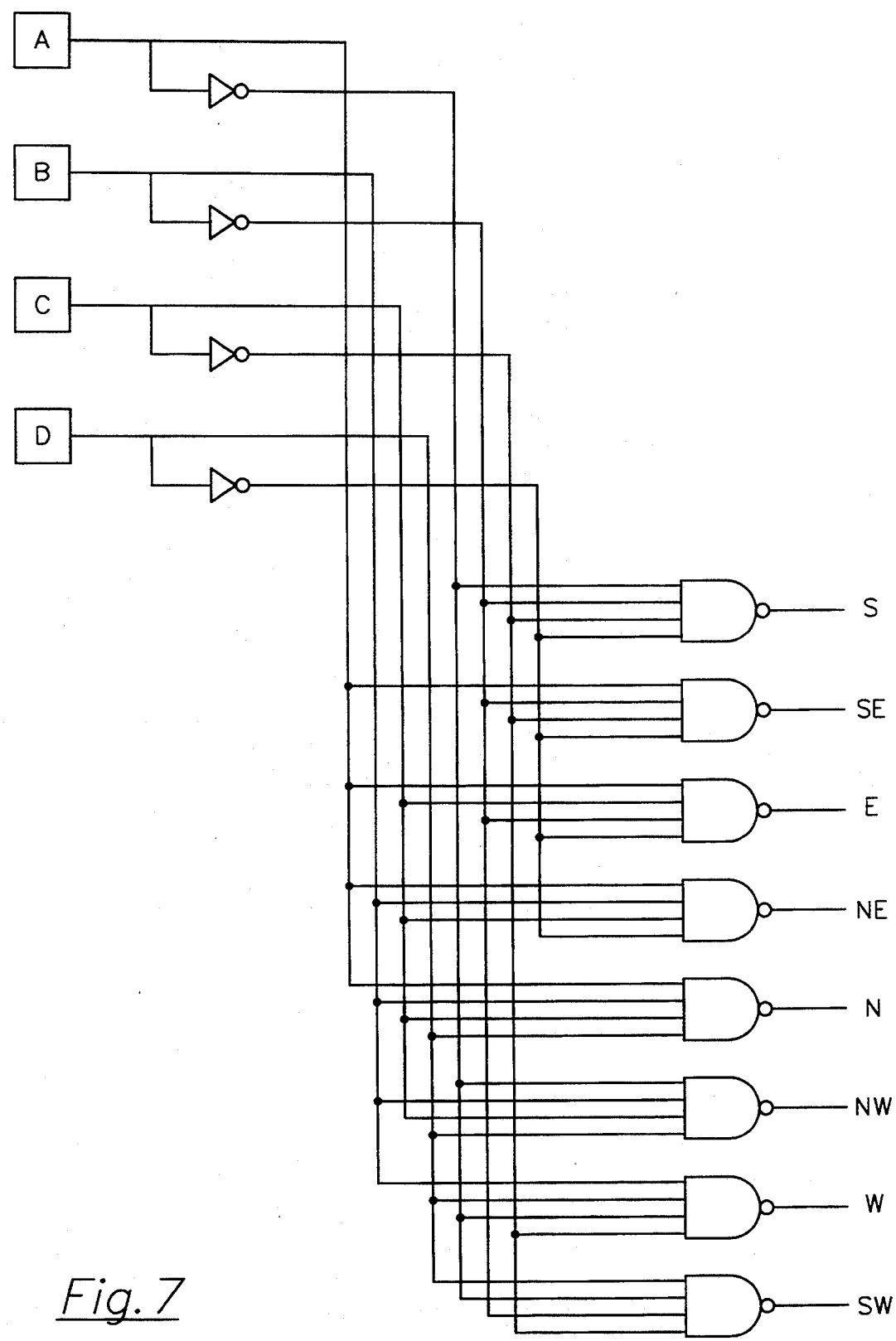
FIG. 7 shows the basic relationship between four output signals of the present invention and eight compass directional positions.

FIG. 7 illustrates a very simple and basic approach to converting the square wave signals, represented by A-D in FIG. 5, to one of eight possible output states which can be used to indicate the compass direction in which the present invention is pointing. In FIG. 7, the boxes labeled A, B, C and D are schematic illustrations which are intended to show a source of the square wave signals represented in FIG. 5. The square wave signals are connected to a plurality of NAND gates which have outputs labeled with eight compass directions. The logical arrangement shown in FIG. 7 would result in one and only one of the NAND gates having a low output at any given time. Those signals could possibly be used to provide an output signal for an electronic compass.

Figures 8, 9:
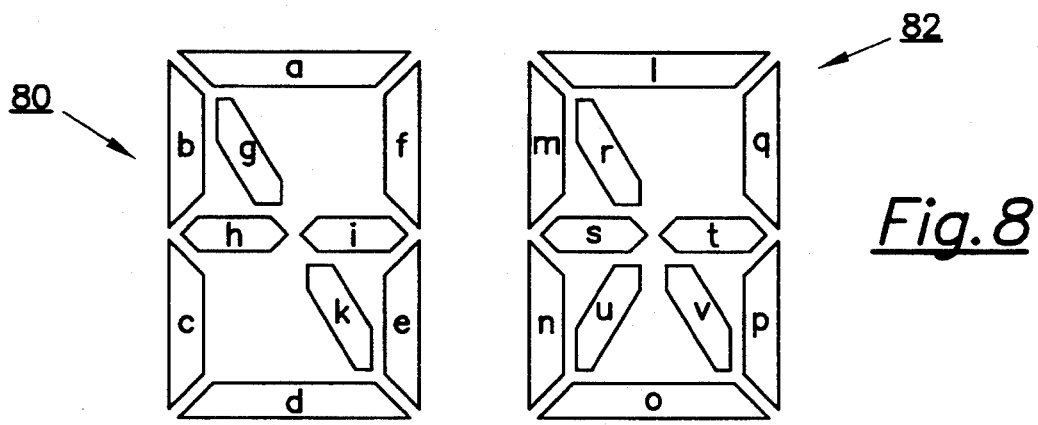
FIG. 8 illustrates two multi segment displays.
FIG. 9 is a tabular representation of the relationship between the segments of the displays in FIG. 8, compass directions and the grey code output of the present invention.

FIG. 8 illustrates two multiple segment displays associated to form a two-letter representation. Each segment of the two displays is identified by a letter which will be used to specifically refer to particular segments of the displays. In this specific application of the present invention, the left display 80 would be used to represent either N or S and the right display 82 would be used to represent either N, W, S or E.

Figure 10:
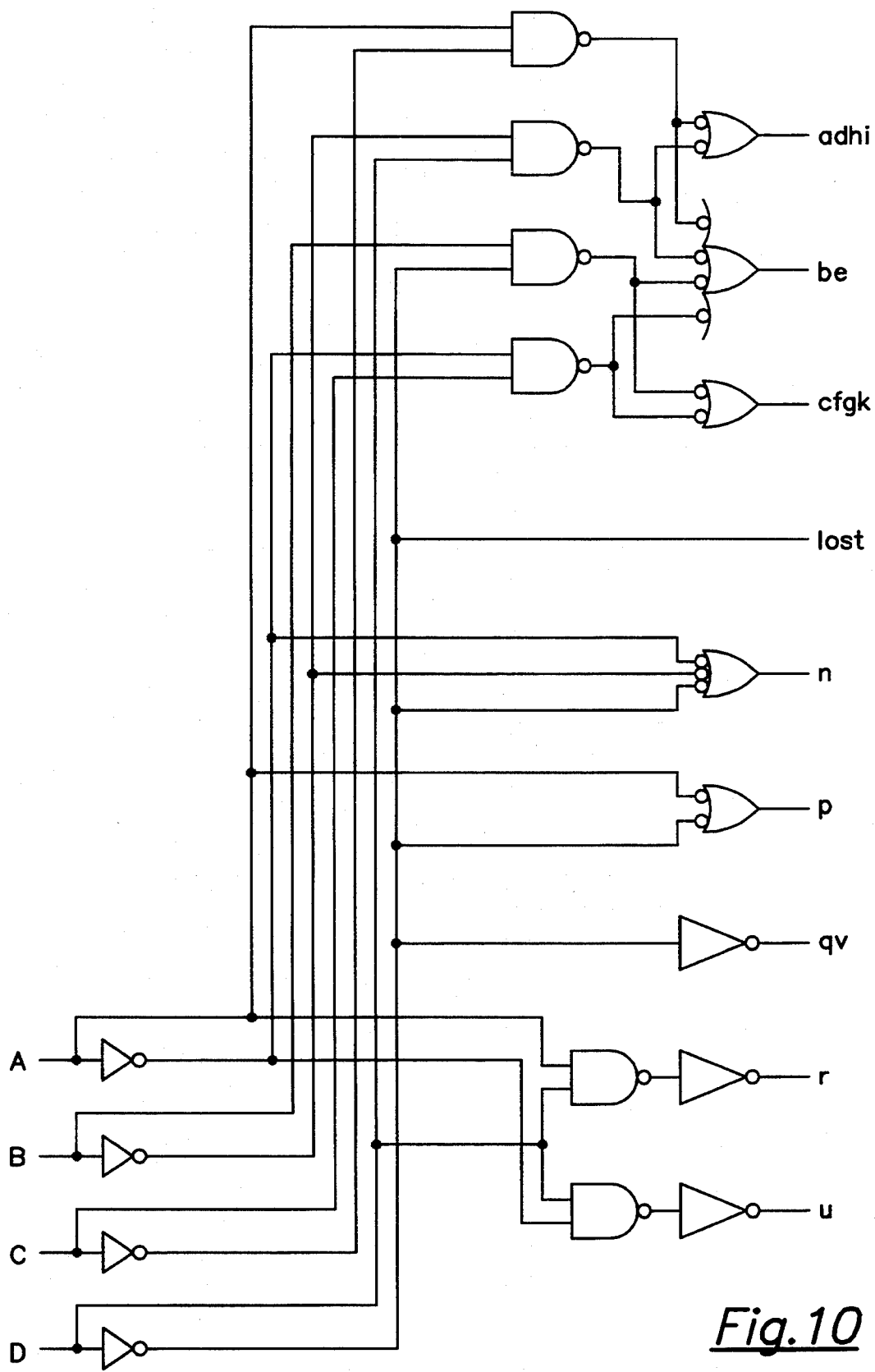
FIGS. 10 and 11 are two alternative logic circuits capable of being used in association with the present invention.

FIG. 9 is a tabular representation of the desired display, the Grey code output from the present invention, and the left and right display segments which must be energized to result in the proper output representation. As can be seen by comparing FIGS. 8 and 9, a Grey code of "1111" from the four magnetically sensitive components must show an N on the right display and a blank on the left display. The elements identified by letters m, n, p, q, r and v should be energized to result in this output. FIG. 9 shows all of the relationships between the output letters representing the compass direction, the Grey code representing the square wave signals for the A, B, C and D magnetically sensitive components and the necessary display elements that must be energized. As is well known to those skilled in the art, there are many alternative logic circuits which can be implemented to result in the proper energization of the elements described above and illustrated in FIGS. 8 and 9. For example, the logic circuit shown in FIG. 10 shows the interconnection of the output signals from the four magnetically sensitive components, A-D, to result in selected combinations of display segments being energized. The logic circuit shown in FIG. 10 is one which permits the present invention to be implemented at a relatively low cost. It utilizes logic gates which are available in commercial quantities at relatively low prices.

Figure 11:
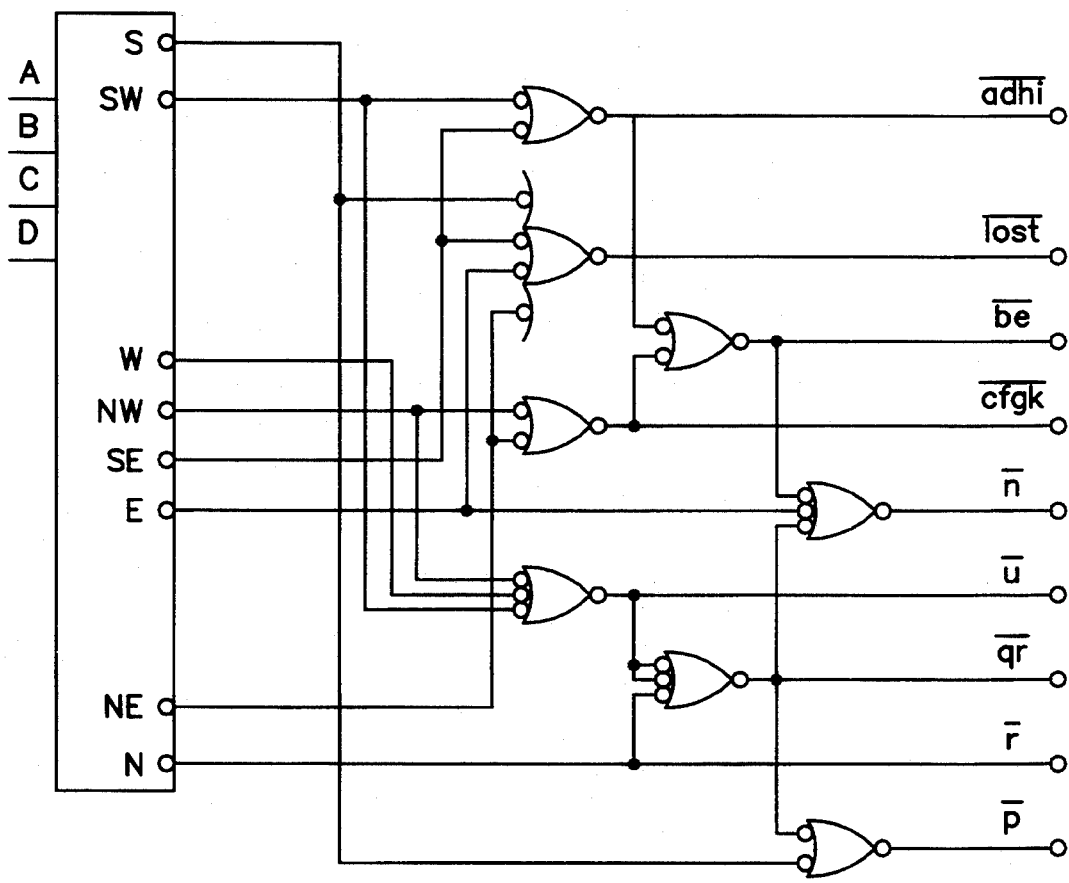

FIG. 11 illustrates an alternative approach to provide the proper energization of the segments illustrated in FIGS. 8 and 9. The four inputs from the magnetically sensitive components, A-D, are provided as inputs to a decoder such as that which appears in FIG. 7. In comparing the two alternative designs shown in FIGS. 10 and 11, it should be understood that the circuit in FIG. 10 is particularly designed to minimize cost while the circuit in FIG. 11 is particularly designed to minimize the risk of having an incorrect output on the display of FIG. 8 in response to loss of one of the intermediate signals or interconnections.

Figure 12:
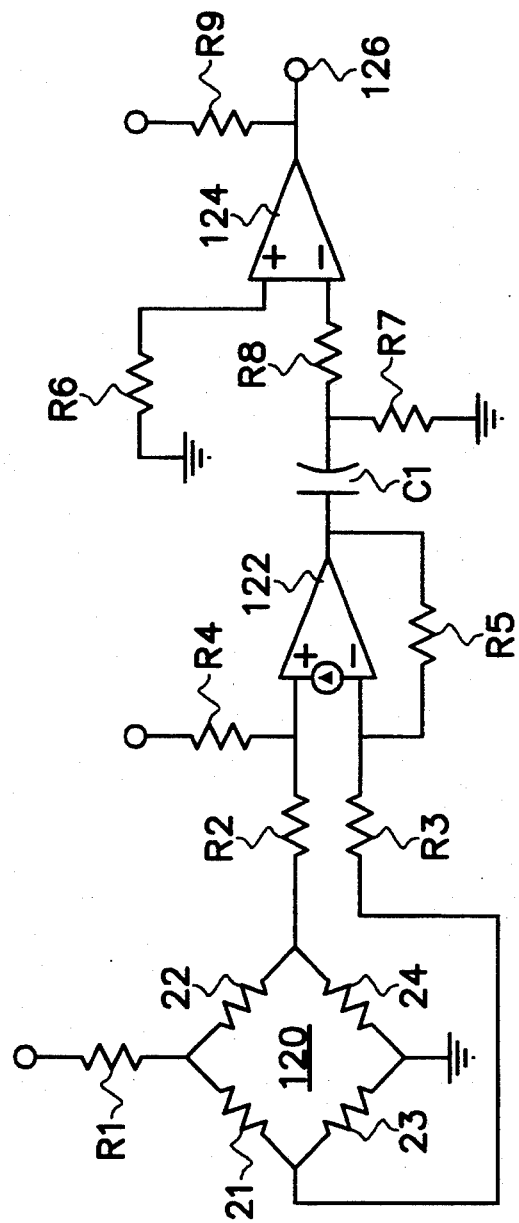
FIG. 12 is a circuit capable of use with magnetoresistors to provide a binary output that can be used by the present invention.

FIG. 12 illustrates a bridge 120 that comprises four magnetoresistive elements, 21-24. In a particularly preferred embodiment of the present invention, each of the magnetoresistive elements is a permalloy resistor. It should be understood that the circuit arrangement shown in FIG. 12 is one of many different types of sensor arrangements which are known to the skilled artisan and can be used in conjunction with the present invention. The important characteristic of any circuit used with the present invention is that it can provide an output, such as that identified by reference numeral 126 in FIG. 12, which is binary in nature and which provides a logic 1 signal to represent the component of a magnetic field in a first direction along the sensing axis and a logic zero signal to represent that component of the magnetic field in an opposite direction along the sensing axis. The resistors R1–R9, the capacitor C1, the operational amplifier 122 and the comparator 124, which are illustrated in FIG. 12, are described in more specific detail in Table II below. The present invention provides a plurality of these sensing components disposed with their respective sensing axes arranged at equal angles relative to each other. In addition, the magnetically sensitive components are physically arranged to result in their output signals being useable in a Grey code. That Grey code arrangement can be used to energize a display that provides an output representing compass directions.

Table I shows the grey code outputs from magnetically sensitive components A–D and their representative compass direction. The advantage of a Grey code combination is that the change of a single one of the four bits only changes the compass direction output to the next most proximate direction. The use of Grey code combinations is well known to those skilled in the art in order to take advantage of this advantageous characteristic of the Grey code. Table II shows the components in FIG. 10 and the magnitude or identification of the component for use in one particularly preferred embodiment of the present invention.

TABLE I

| GREY CODE | | | | |
|---|---|---|---|---|
| A | B | C | D | DIRECTION |
| 0 | 0 | 0 | 0 | S |
| 1 | 0 | 0 | 0 | SE |
| 1 | 0 | 1 | 0 | E |
| 1 | 1 | 1 | 0 | NE |
| 1 | 1 | 1 | 1 | N |
| 0 | 1 | 1 | 1 | NW |
| 0 | 1 | 0 | 1 | W |
| 0 | 0 | 0 | 1 | SW |

TABLE II

| Reference | Magnitude or identification |
|---|---|
| R1 | 1.2 KΩ |
| R2 | 47 KΩ |
| R3 | 47 KΩ |
| R4 | 2 MΩ |
| R5 | 1 MΩ |
| R6 | 15 KΩ |
| R7 | 6.8 KΩ |
| R8 | 8.2 KΩ |
| R9 | 100 KΩ |
| 122 | LM2900 (operational amplifier) |
| 124 | LM2901 (comparator) |
| C1 | 1 μF |

As can be seen from the above discussion, the present invention provides an arrangement of known magnetically sensitive components in which the number of individual directions capable of being displayed is related to the number of components used by a ratio of two to one. In other words, using N magnetically sensitive components used in association with the present invention provides two times N compass point directions that can be resolved.

Although the present invention has been described to show one particularly preferred embodiment, it should be understood that alternative embodiments of the present invention are also within its scope.

The embodiments of the invention in which an exclusive property or right is claimed are defined as follows:

1. Apparatus for determining the direction of a magnetic field, comprising:

a plurality of magnetoresistive devices, each of said magnetoresistive devices having a predefined sensing axis and the capability of resolving the presence of a component of a magnetic field between two opposite ranges of directions along said sensing axis, said ranges of directions being generally northerly and generally southerly, said plurality of magnetoresistive devices being arranged with their axes equally spaced apart from each other by a preselected angle, each of said plurality of magnetoresistive devices having a first binary output signal that is representative of the existence of a magnetic field component in a preselected one of the two possible directions along its axis;

means for logically combining said first binary output signal from each of said plurality of magnetoresistive devices to provide a predefined one of a plurality of second output signals representing the direction of said magnetic field, said second output signals represent magnetic compass direction; and means for converting said plurality of second output signals to a form that is compatible with a multiple segment display element.

2. The apparatus of claim 1, wherein:

said combining means comprises a means for providing a plurality of output bits in the form of a Grey code.

3. The apparatus of claim 1, wherein:

each of said plurality of magnetoresistive devices comprises a wheatstone bridge arrangement of magnetoresistive elements.

4. The apparatus of claim 3, wherein:

each of said magnetoresistive elements comprises a permalloy material.

5. Apparatus for determining the direction of a magnetic fields, comprising:

a plurality of magnetoresistive devices, each of said magnetoresistive devices having a predefined sensing axis and the capability of resolving the presence of a component of a magnetic field between two opposite ranges of directions along said sensing axis, said two opposite ranges being more north than south and more south than north, said plurality of magnetoresistive devices being arranged with their axes equally spaced apart from each other by an angle defined by $$A = 360/2N$$

where A is the angular spacing between adjacent axes and N is the number of magnetoresistive devices, each of said plurality of magnetoresistive devices having a first binary output signal that is representative of the existence of a magnetic field component in a preselected one of the two possible directions along its axis;

means for logically combining said first binary output signal from each of said plurality of magnetoresistive devices to provide a predefined one of a plurality of second output signals representing the direction of said magnetic field; and means for converting said plurality of second output signals to a form that is compatible with a multiple segment display element, said second output signals represent magnetic compass directions.

6. The apparatus of claim 5, wherein:

said combining means comprises a means for providing a plurality of output bits in the form of a Grey code.

7. Apparatus for determining the direction of a magnetic field, comprising:

a plurality of magnetically sensitive devices, each of said magnetically sensitive devices comprising at least one magnetoresistive element and having a predefined sensing axis and the capability of resolving the presence of a component of a magnetic field between two opposite ranges of directions along said sensing axis, said two opposite ranges of direction each consisting of 180 degrees of rotation said plurality of magnetically sensitive devices being arranged with their axes equally spaced apart from each other by an angle defined by $$A = 360/2N$$

where A is the angular spacing between adjacent axes and N is the number of magnetically sensitive devices, each of said plurality of magnetically sensitive devices having a first binary output signal that is representative of the existence of a magnetic field component in a preselected one of the two possible directions along its axis;

means for logically combining said first binary output signal from each of said plurality of magnetically sensitive devices to provide a predefined one of a plurality of second output signals representing the direction of said magnetic field in the form of a Grey code output pattern; and means for converting said plurality of second output signals to a form that is compatible with a multiple segment display element, said second output signals represent magnetic compass directions.

* * * * *